United States Patent [19]
Trumper et al.

[11] Patent Number: 5,631,618
[45] Date of Patent: May 20, 1997

[54] MAGNETIC ARRAYS

[75] Inventors: David L. Trumper, Plaistow, N.H.; Won-jong Kim, Cambridge, Mass.; Mark E. Williams, Pelham, N.H.

[73] Assignee: Massachusetts Institute of Technology, Cambridge, Mass.

[21] Appl. No.: 316,278

[22] Filed: Sep. 30, 1994

[51] Int. Cl.$^6$ ............................................. H01F 5/00
[52] U.S. Cl. ........................... 335/299; 335/216; 104/286
[58] Field of Search .............................. 335/216, 299; 310/12–4, 90.5; 104/281–6

[56] References Cited

U.S. PATENT DOCUMENTS 3,531,744  9/1970  Kafka ................................. 335/299
4,878,024  10/1989  Overweg et al. ..................... 335/299

*Primary Examiner*—Lincoln Donovan
*Attorney, Agent, or Firm*—Wolf, Greenfield & Sacks, P.C.

[57] ABSTRACT

Electromagnet arrays which can provide selected field patterns in either two or three dimensions, and in particular, which can provide single-sided field patterns in two or three dimensions. These features are achieved by providing arrays which have current densities that vary in the windings both parallel to the array and in the direction of array thickness.

16 Claims, 5 Drawing Sheets

(a)

| B | A' | C | D' | E | F' | G | H' | I | J' |
|---|----|---|----|---|----|---|----|---|----|
| A | B' | D | C' | F | E' | H | G' | J | I' |

(b)

| X | ⊙ | X | X | ⊙ | X | ⊙ | ⊙ | X | ⊙ |
|---|---|---|---|---|---|---|---|---|---|
| X | ⊙ | ⊙ | ⊙ | ⊙ | X | X | X | X | ⊙ |

↓ ← ↑ → ↓

(c)

| ⊙ | ⊙ | X | ⊙ | X | X | ⊙ | X | ⊙ | ⊙ |
|---|---|---|---|---|---|---|---|---|---|
| X | X | X | ⊙ | ⊙ | ⊙ | ⊙ | X | X | X |

→ ↓ ← ↑ →

(d)

| ⊙ | X | ⊙ | ⊙ | X | ⊙ | X | X | ⊙ | X |
|---|---|---|---|---|---|---|---|---|---|
| ⊙ | X | X | X | X | ⊙ | ⊙ | ⊙ | ⊙ | X |

↑ → ↓ ← ↑

(e)

| X | X | ⊙ | X | ⊙ | ⊙ | X | ⊙ | X | X |
|---|---|---|---|---|---|---|---|---|---|
| ⊙ | ⊙ | ⊙ | X | X | X | X | ⊙ | ⊙ | ⊙ |

← ↑ → ↓ ←

PHASE 1

(f) A – A' – C – C' – F' – F – G' – G – J – J'

PHASE 2

MAGNETIC ARRAYS

This invention was made with government support under contract Number DE-AC04-94 AL85000 awarded by the Department of Energy. The government has certain rights in the invention.

FIELD OF THE INVENTION

This invention relates to magnetic arrays and more particularly to magnetic array structures which are extensions of Halbach magnet arrays.

BACKGROUND OF THE INVENTION

In a typical magnetic array, such as those used for linear motors, alternate magnet segments in the array are magnetically oriented in directions which are 180° rotated from each other about an axis perpendicular to the direction in which the array extends. Such arrays produce magnetic fields which are more or less symmetrically distributed on both sides of the array. However, there are applications where a modified, controlled magnetic field or force pattern may be desired. In particular, since in a typical application only the field on one side of the array is utilized, half of the field is typically wasted. Further, in some applications there may be a need to shield the field on the unused side of the array. Magnetic arrays which provide a selectively controlled field pattern, and more particularly, which are adapted to provide a single-sided field pattern, are therefore desirable.

One type of magnetic array which has been available for some years and which provides a magnetic field which is limited to one side of the array is discussed in several articles by K. Halbach ("Design of Permanent Multipole Magnets With Oriented Rare Earth Cobalt Material", Nuclear Instruments and Methods, Vol. 169, No. 1, pp. 1–10, 1980; and "Application of Permanent Magnets In Accelerators and Electron Storage Rings", Journal of Applied Physics, Vol. 57, No. 8 pp. 3605–3608, 1985). These permanent magnet arrays differ from standard arrays in that each adjacent magnet segment is oriented around an axis perpendicular to the direction in which the array extends by an angle which differs from that of the adjacent segment by a selected angle, for example 45° or 90°, which results in magnetic axes which are both array normal and array parallel. As taught by Halbach, the angle of rotation and the direction of rotation are the same for each adjacent pair of magnet segments. An added advantage of these arrays is that they provide a field which is a factor of √2 stronger than the field for more conventional magnet arrays with the same volume. These magnet arrays will sometimes be referred to hereinafter as Halbach magnets or Halbach arrays.

However, while Halbach arrays have some interesting properties, they have received little attention and only limited utilization outside of particle physics applications. One potential reason for this is that, while many applications for magnet arrays, such as motors and postioners, require electromagnetic array, Halbach arrays have heretofore only been implemented in permanent magnet form. A need therefore exists for an electromagnetic analog of Halbach arrays which would permit single sided fields to be electromagnetically generated.

Further, it would be desirable if electromagnetic Halbach array could be structured to make the field more uniformly sinusoidal on the strong side of the array and to minimize stray fields on the weak side of the array. Such fields would preferably also be easily switched from one side of the array to the other. More generally, it would be desirable if an electromagnetic array could be structured to provide selected magnetic field patterns as appropriate for a particular application.

Further, Halbach arrays have heretofore been single dimensional arrays. In order to enhance the utility of such arrays, it would be desirable if the principles of such arrays could be adapted to provide three-dimensional field patterns, and more generally, if selected three-dimensional field patterns could be generated by properly structuring magnetic arrays.

SUMMARY OF THE INVENTION

In accordance with the above, this invention provides electromagnet arrays which can provide selected field patterns in either two or three dimensions, and in particular, which can provide single-sided field patterns in two or three dimensions. These features are achieved by providing arrays which have current densities that vary in the windings both parallel to the array and in the direction of array thickness.

For preferred embodiments, the electromagnet array has a plurality of adjacent electromagnet segments which extend in at least one dimension, with each electromagnet segment having a magnetic orientation about an axis perpendicular to the dimension which is rotated by a selected angle from the orientation of each adjacent electromagnet segment. The angle of rotation and the direction of rotation are preferably the same for each adjacent pair of electromagnets and are such that the array has magnetic axes which are both normal and parallel to the dimension in which the array extends. Electric currents are selectively applied to the electromagnetic segments. Currents may be applied to the segments in a predetermined sequence to achieve commutation or for other purposes. Windings in at least two different phases may be provided for each segment with appropriate currents being applied to the windings of each phase.

The winding pattern may be triangular or may be rectangular and the direction in which current flows may be selectively reversed to change the side of the array on which the magnetic field appears. The windings of the electromagnetic segments may also be formed of a material which is superconducting below a selected temperature and a suitable means may be provided for maintaining the windings for at least the segments to which current is being applied below the selected temperature. Superconducting winding embodiments are particularly suitable for use in maglev applications where electromagnets would be provided in the track to interact with the array to provide lift. For preferred embodiments, the selected angle by which the magnet orientation is rotated between adjacent segments is not more than 90°.

Embodiments are also provided wherein permanent magnet or electromagnet segments extend in two dimensions, the array being formed of a matrix of rows and columns of magnet segments, with each magnet having a three-dimensional magnetic orientation which is the sum of the magnetic orientations for the segments for its corresponding row and column. In particular, a plurality of magnet segments may be arranged in a two-dimensional matrix array of rows and columns, with each segment having at least one adjacent row segment and at least one adjacent column segment. Each of the segments has a three-dimensional magnetic orientation which is the vector sum of a nominal magnetic orientation for the segment's row and a nominal magnetic orientation for the segment's column. Adjacent segments in each column have a nominal magnetic orientation about a row axis which is rotated in a selected direction by an angle which is preferably not more than 90° in a selected direction from the nominal column magnetic rotation of each adjacent segment of the column, and adjacent segments in each row have nominal magnetic orientation about eight column axes which is rotated in a selected direction by an angle of not more than 90° in a selected direction from the nominal row magnetic orientation of each adjacent segment in the row.

DESCRIPTION OF THE DRAWINGS

FIG. 7 is a front view diagram for an alternative two-phase embodiment which also illustrates how commutation may be accomplished.

DETAILED DESCRIPTION

Figure 1:
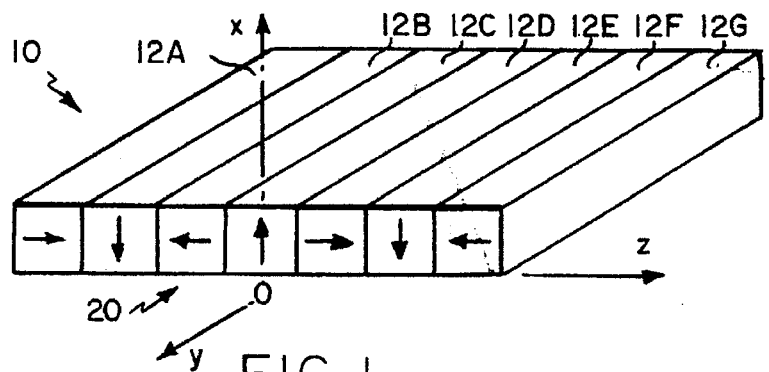
FIG. 1 is an illustration of a prior art permanent magnet Halbach magnetic array.

FIG. 1 shows a prior art permanent magnet array IO developed by Klaus Halbach. The array differs from standard magnetic arrays in that the magnetic orientation between adjacent magnetic segments 12A–12G differ by 90°, rather than by 180°. For the embodiment shown in FIG. 1, the magnetic orientations between successive segments 12 rotate in a clockwise direction when moving from left to right. As previously indicated, standard magnetic arrays with adjacent segments differing in magnetic orientation by 180° have substantially symmetric magnetic fields on the top of the array (i.e., the side facing upward in the x direction) and the bottom of the array. Conversely, the array shown in FIG. 1, which will sometimes be referred to hereinafter as a Halbach magnet or Halbach array, has a strong side and a weak side, there being little if any magnetic field on the weak side. For the magnets rotating in the clockwise direction as shown in FIG. 1, the strong side of the array is on the bottom side 20 and the weak side of the array is the top side 22. If the rotation between successive segments 12 were in the counterclockwise direction, the strong side would be on the top and the weak side on the bottom. Halbach arrays also have the advantage of providing a 42 times stronger field than that of more conventional ironless magnet arrays of the same volume.

While of significant academic interest, Halbach arrays have heretofore found only limited commercial application, for example, in undulators and wigglers of particle accelerators. One reason for this is that the use of permanent magnets for these arrays has limited their versatility and adaptability for applications where magnetic arrays are typically used. In particular, electromagnet arrays are frequently required in various positioner and motor applications, including maglev applications. An electromagnet capable of providing the single-sided field of Halbach arrays is therefore desirable.

Figure 2A:
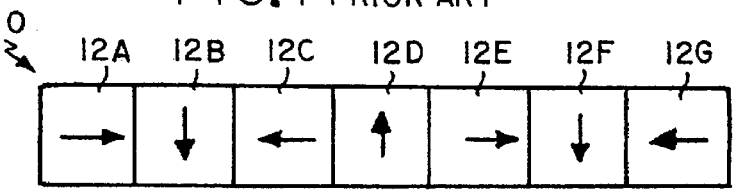
FIG. 2A is a front view of the magnetic array shown in FIG. 1.
Figure 2B:
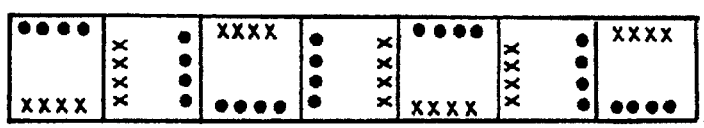
FIGS. 2B and 2C are front views of electromagnetic analogs for the permanent magnet array shown in FIG. 2A.

FIG. 2A is a front view of the magnet array shown in FIG. 1 and FIG. 2B is a similar view of an electromagnet analog 14 of this array. However, to implement the winding pattern shown in FIG. 2B, with the X's indicating windings going into the paper and the dots indicating windings coming out of the paper requires true surface currents, and to achieve true surface currents requires infinite current density in the wires, which is obviously not possible. Other winding patterns for the electromagnets are therefore required.

Figure 2C:
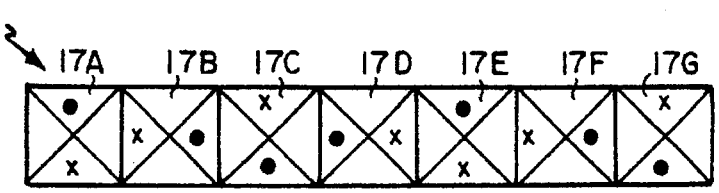

FIG. 2C shows an array 16 having a triangular winding pattern which is particularly advantageous for this application. In particular, this pattern provides varying currents through the thickness of the magnet which permits the field to be controlled. It is also a relatively simple pattern to wind and results in shorter lead lengths which minimize power dissipation for a given field strength. The triangular winding pattern array shown in FIG. 2C produces a single-sided magnetic field pattern. Commutation may be achieved by successively energizing the electromagnetic segments 17A–17G of array 16 in some predetermined pattern. The pattern for this array, which would be similar to that shown in FIG. 6, but not as well formed and with the weak and strong sides reversed, has a strong side 20 and a weak side 22 which is dictated by both the triangular winding pattern, which gives a particular depth profile to the magnetic field, and by the direction of rotation of magnetic orientation for successive segments 17 of the array. This results in the array having both array normal and array parallel magnetic axes which are spacially distributed so as to produce the substantially single-sided field. However, with a different winding pattern on the array which produces a different depth profile for the magnetic field of each segment, a different selected magnetic field profile may be obtained. In particular, parameters can be selected which can be solved using Fourier analysis to produce a winding pattern to achieve desired field patterns, as will be discussed in greater detail later. The field pattern selected will depend on application.

Figure 3:
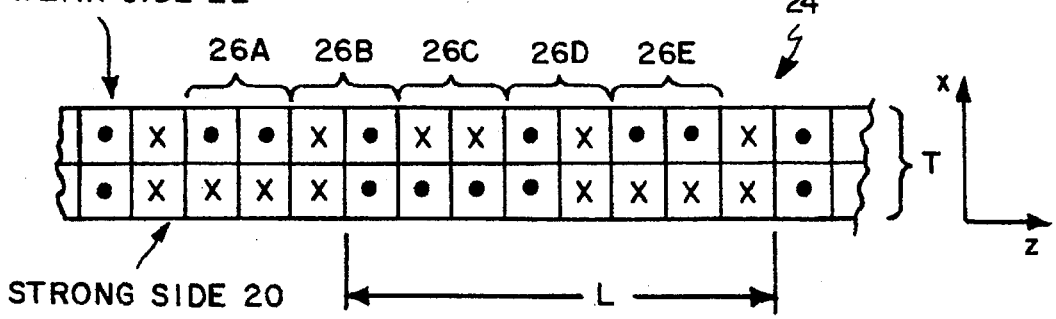
FIG. 3 is a front view diagram for an alternative embodiment of an electromagnetic array in accordance with the teachings of this invention.

FIG. 3 shows an array 24 having another winding pattern which produces results substantially similar to those for the array 16 shown in FIG. 2C. This array has rectangular segments 26, each of which is made up of a pair of adjacent windings with adjacent segments being rotated in the same manner as for array 16. As for the earlier array, bottom side 20 is the strong side and upper side 22 is the weak side. While two windings have been shown per segment for the array 24, and this configuration is preferable for the array, particularly where commutation is desired, in applications where commutation is not required, each segment 26 could be formed of a single winding oriented in the manner shown. In FIG. 3, the length L indicates the periodicity of the array (i.e., the length of the array before the winding pattern repeats). The winding pattern of FIG. 3 also provides the current density varying in both the X and Z direction required to achieve a controlled magnetic field pattern in general, and a substantially single-sided magnetic field in particular.

For either the array 16 of FIG. 2C or the array 24 of FIG. 3, a Fourier analysis shows that if the spacial period L is four times as long as the thickness T of the array, then the fundamental component of the field on weak side 22 will be substantially equal to zero. To the extent this condition exists, the fundamental field on the weak side is approximately equal to zero. However, non-zero higher order components of the field still exist on both sides of the array. The magnetic field resulting from these higher order components is generally negligible for the disclosed embodiments. However, even if the L=4T relationship is not absolutely met for the array, the increase in the weak side magnetic field will not be substantial and for most cases a substantially single-sided field will still be provided.

Halbach recognized that a more uniformly sinusoidal field on the strong side could be achieved by having the magnetic orientation continuously rotate in the selected direction along the array, rather than by having discrete 90° changes in the field. However, with either permanent magnets or electromagnets, it is increasingly expensive to assemble the arrays as the angle between adjacent segments decreases. This places a practical limit on the quality of waveform which can be achieved, and in particular on the degree of weak side suppression which can be obtained.

Figure 4:
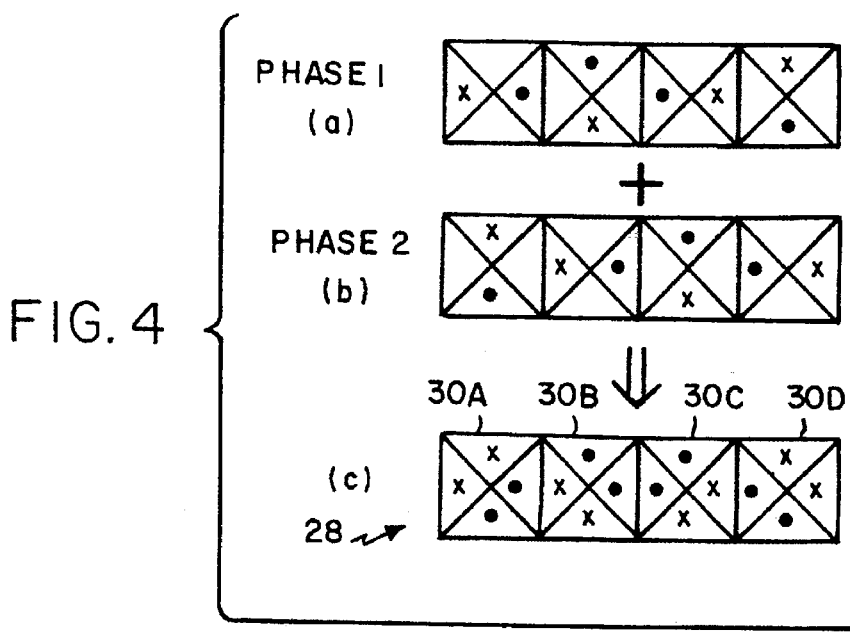
FIG. 4 is a front view diagrammatically illustrating the two phases for still another embodiment of an electromagnetic array in accordance with the teachings of this invention and of the array as it is constructed.

FIG. 4 illustrates a technique which may be utilized to achieve significantly enhanced resolution for electromagnetic embodiments resulting both in a more perfectly sinusoidal magnetic field on the strong side and enhanced suppression of harmonics, such suppression further smoothing the wave shape on the strong side and reducing stray field on the weak side. In particular, FIG. 4 shows an array of the type shown in FIG. 2C which has been modified so as to be a two-phase array. The windings for phase 1 of a single period of the array are shown on line a of FIG. 4, while the windings for a phase 2, which are 90° behind those of phase 1 are shown on line b. Line c shows the actual windings for the two-phase array which is a combination of the phase 1 and phase 2 windings on lines a and b, respectively. The sine waves for the fields resulting from the two phases for the array on line c at FIG. 4 combine to provide a magnetic field which more closely approximates that for continuous rotation in field direction, with a smoother sinusoidal field on the strong side and enhanced suppression of harmonic caused fields on the weak side.

A further reduction in harmonics, resulting in even closer approximations to the ideal of continuous field direction rotation can be achieved with more complicated winding patterns providing three-phase operation, four-phase operation, . . . n phase operation. While for most applications, the incremental benefits from going beyond two phases probably do not warrant the added cost of the array, and the added complexity of control, for n phase operation, for applications where any magnetic field on the weak side is not acceptable and/or where a very sinusoidal magnetic field on the strong side is required, the option is available to increase the number of phases for the array until the desired field pattern is achieved.

Figure 5:
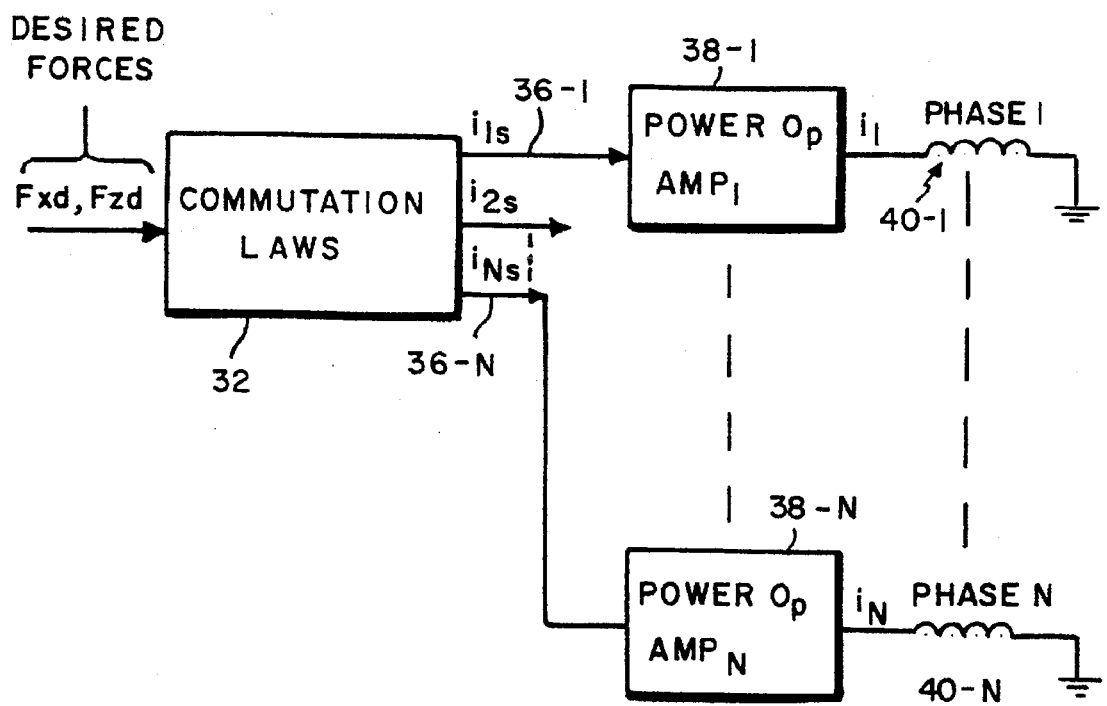
FIG. 5 is a block schematic diagram of a control circuit for a multi-phase array of the type shown in FIG. 4.

In operation, all n phases would typically be applied simultaneously to each active segment of a multi-phase array, with the relative current applied to the coil for each phase being controlled to achieve the desired forces. FIG. 5 illustrates a simple circuit which may be utilized to control the currents applied for each phase of each segment or stage 30 as a function of the desired magnetic fields in the X and Z directions for such stage. Referring to FIG. 5, a circuit 32 is provided which contains the commutation laws to be applied for determining currents as a function of desired fields. An example of how such laws may be applied with two-phase commutation in a somewhat different environment are taught in "Magnetic Arrays For Synchronous Machines", D. L. Trumper, M. E. Williams, and T. H. Nguyen, Proceedings of the IEEE IAS 28th Annual Meeting, pp. 9–18, October, 1993. Device 32 may be a general purpose microprocessor or other processor programmed to perform the current determinations in accordance with the commutation laws, may be special purpose circuitry designed to perform this function, may be a computer which is programmed to perform this function in conjunction with other functions as part of a system, or may be a hybrid hardware/software device. The inputs to device 32 are desired forces which would normally also be computer determined in accordance with a predetermined algorithm and the outputs are resultant currents for each phase for a particular magnet segment 30. The output currents appearing on lines 36-1 through 36-N are applied through corresponding power operational amplifier or other suitable devices 38-1 to 38-N to the coil 40-1 to 40-N for the phase. Typically, a single commutation law circuit or device 32 would be utilized to determine the currents to be applied for the various phases for all of the segments/stages of an array 28.

Figure 6:
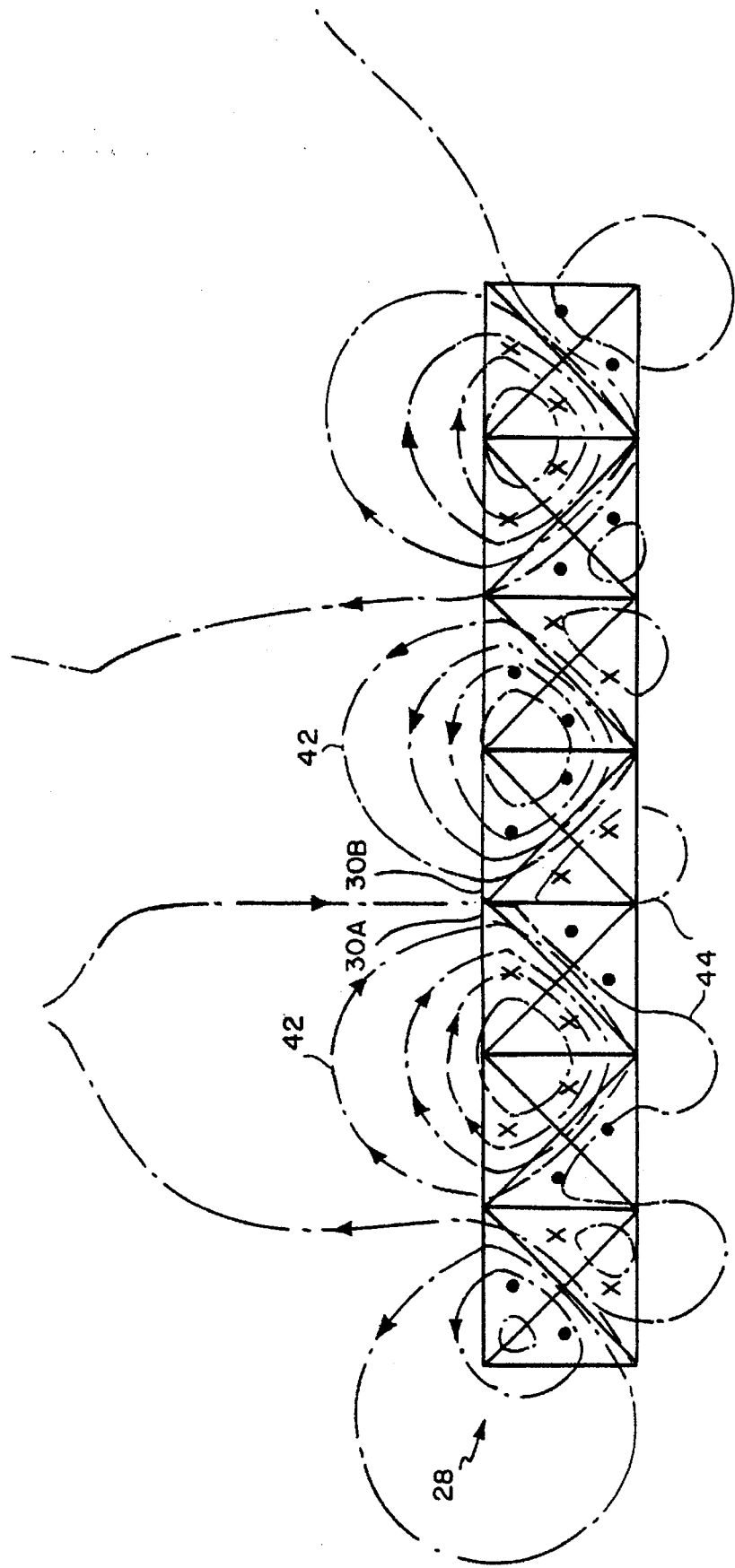
FIG. 6 is a diagram illustrating magnetic field patterns for an electromagnetic array of the type shown in FIG. 4.

FIG. 6 illustrates the magnetic field pattern for the two-phase array 28 of FIG. 4. In this drawing, it is seen that, for this array, the strong side and weak side are reversed from that for the arrays of FIG. 2C and FIG. 3, that with some limited exception the magnetic flux lines 42 on the strong side of the array have a fairly smooth sinusoidal shape and that the stray fields 44 on the weak side of the array are minimal. As discussed earlier, further improvement in the wave shape on the strong side and further suppression of field on the weak side may be achievable by increasing the number of phases for each segment 30 of the array.

FIG. 7 illustrates an alternative two-phase array 46. Line a illustrates various rectangular elements of this array with lines f and g indicating the elements on line a which are used for each of the two phases. Thus, phase 1 uses elements A—A, C—C, F—F, G—G, and J—J. Similarly, phase 2 utilizes elements B—B, D—D, E—E, H—H, and I—I. Lines b, c, d and e show illustrative current directions, with x being into the paper and the dots being out of the paper for the various winding at successive time intervals in order to achieve commutation with movement from left to right.

While as previously discussed, permanent magnet Halbach arrays are advantageous in that they provide a fundamental field which is stronger by a factor of √2 than conventional permanent magnet arrays, this improved performance is not true for electromagnetic arrays which normally produce a single-sided field having a magnitude which is roughly 53% of that for a conventional pattern with the same consumption of electric power. Therefore, such single-sided windings are not likely to be used in power sensitive applications.

However, notwithstanding the above, such magnet arrays do have a number of advantages which may allow for their use in appropriate applications. Among the advantages are:
(1) no fundamental of the magnetic field on the weak side 22;
(2) near sinusoidal magnetic field pattern on the strong side 20;
(3) shorter turns for the electromagnetic windings which reduces power dissipation and also makes the motor simpler to manufacture;
(4) simpler driving circuit since only two phases is required;
(5) less magnetic field shielding material for certain applications such as maglev and electric vehicles (this application will be described later);

(6) easy manufacture by modules (each of the segments 30 is an identical module and the segments differ only in the direction in which they are oriented for assembly).

Therefore, for applications where the above advantages are more important than power consumption, the electromagnets described above may be utilized. However, in applications where superconducting coils may be utilized, the increased power is no longer a factor and the advantages of the arrays discussed above, and in particular array 28, would make the use of such arrays very attractive. In particular, in maglev applications one problem is protecting passengers from magnetic fields which appear on the unused side of the magnets and from other stray magnetic fields. Such fields may pose a health risk to passengers, especially those using field sensitive devices such as pacemakers. Thus, extensive shielding must be provided between the magnets and the passenger compartments which significantly increases both the cost and the weight of the vehicle. This invention, with its one-sided fields, should permit a significant reduction in the shielding requirements for such applications and should be practical for such applications since superconducting coils are frequently already used.

Figure 8:
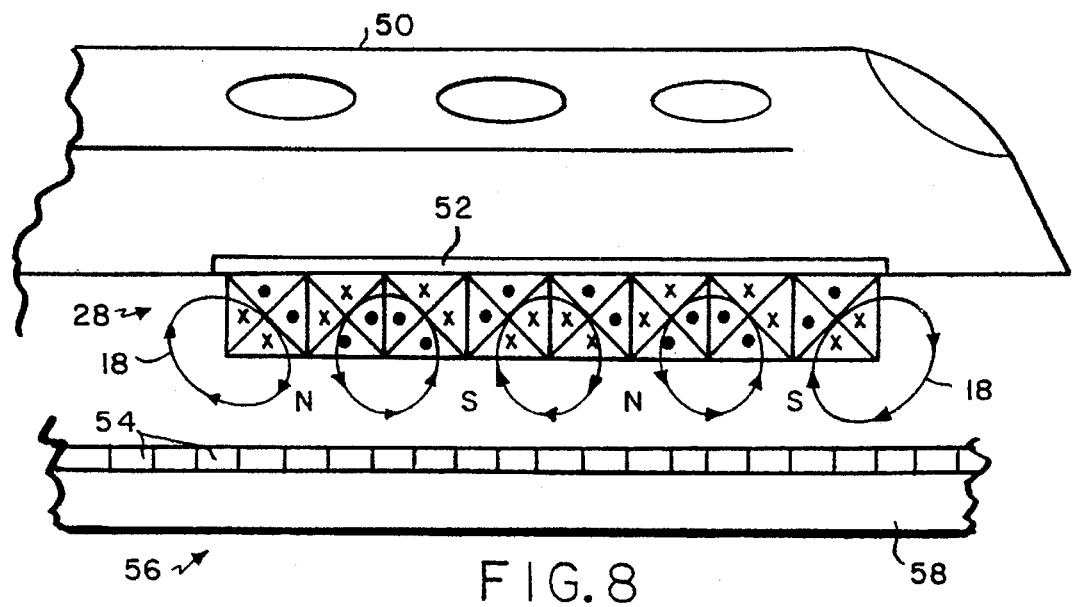
FIG. 8 is a drawing illustrating a maglev application for a two-phase array of the type shown in FIG. 4.

FIG. 8 illustrates a maglev application where the train or other vehicle 50 having a passenger compartment therein has a magnetic array 28 mounted thereunder with two-phase electromagnetic segments 30. While eight segments are shown for array 28 in FIG. 8, the number of segments in the array would vary with application. While some shielding 52 might still be required between the electromagnet array 28 and the passenger compartment of vehicle 50, the single-sided field 18 for such array would significantly reduce such shielding requirements. Further, since the coils for array 28 could be superconducting coils, the power consumption penalty which normally exists for such arrays would not be a problem. As with existing maglev devices, the electromagnetic array 28 would interact with electromagnetic coils 54 on track 56. The coils would be mounted on a structural support 58 which is the other portion of the track.

Figure 9:
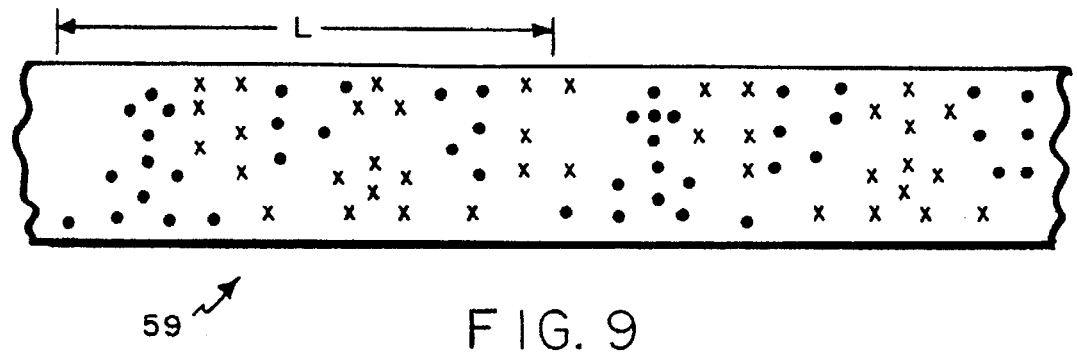
FIG. 9 is a front view diagram for another more generalized embodiment of the invention.

In the discussion to this point, the field pattern provided by all of the electromagnet has been a generally single-sided field with a strong side having a generally sinusoidal shape. However, the capability of designing electromagnetic arrays having current density patterns which vary through the thickness T of the array and, in particular which can be designed by providing a winding pattern for the array which matches the sum of a series of complex exponentials, for example via a Fourier transform in space, permits a variety of specialized field patterns to be achieved. Thus, one could start with a desired field pattern, express such field pattern as a sum of complex exponentials in space, and then generate a winding pattern utilizing techniques known in the art which achieves or matches such a series of complex exponentials. FIG. 9 shows an illustrative winding pattern for such a complex field pattern which pattern has a periodicity L.

Figure 10:
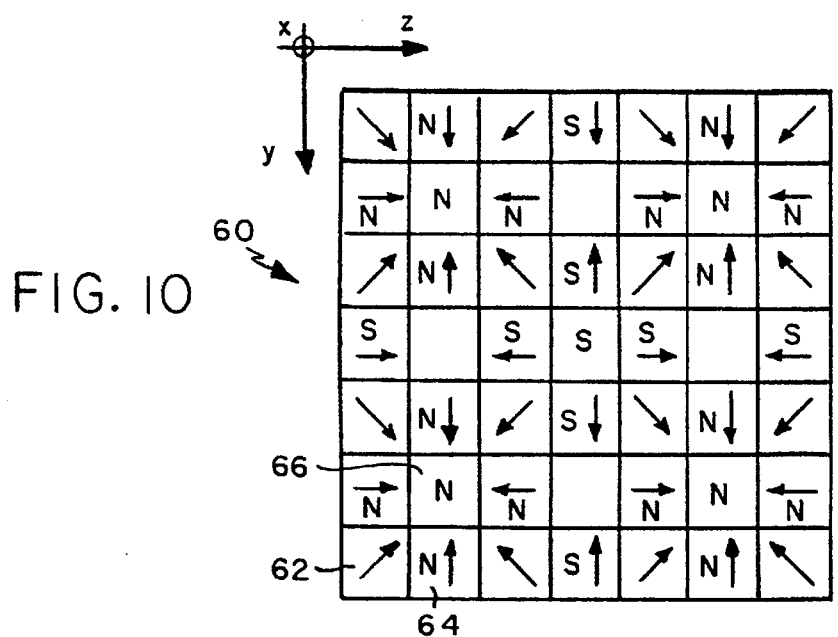
FIG. 10 is a top view of a two-dimensional array in accordance with the teachings of this invention which generates a three-dimensional magnetic field pattern.

In the discussion so far, Halbach arrays and other arrays of either a permanent magnet or electromagnetic variety have been linear arrays. FIG. 10 illustrates an array 60 using Halbach magnet principles which generates fields in three dimensions. The segments for the matrix 60 of magnet segments shown in FIG. 10 are oriented as follows:
N=oriented in the X direction out of the paper
N+arrow=oriented in the direction of the arrow and in the X direction at a 45° angle out of the paper
arrow=oriented in the direction of the arrow
S+arrow=oriented in the direction of the arrow and in the X direction at a 45° angle into the paper
S=oriented in the X direction into the paper
blank=no magnetic field (all magnetic fields cancel)

The orientation for the magnets shown in FIG. 10 are determined as the sum of Halbach arrays preceding from the bottom of the figure to the top of the figure in the Y direction and Halbach arrays preceding from the left of the figure to the right of the figure in the Z direction. Thus, the segment 62 is the sum of a magnetic field facing upward in the Y direction for a Halbach array made up of the left most column of magnetic segments and an orientation to the right for the Halbach array formed by the bottom row of segments. The segment 64 is the sum of the field pointing upward for the first magnet of the Halbach array which constitutes the second column and a field which is rotated 90° for the bottom row to point out of the paper in the X direction. This results in the segment having the indicated orientation. Segment 66 has been rotated for both its row and column to point upward in the X direction and thus has an upward or north orientation. By following the above process, the orientations shown for the remaining magnet segments in the array can be determined.

While because of improved power efficiency, it is assumed that the array 60 shown in FIG. 10 is formed of permanent magnet segments, in suitable applications the array could also be formed of electromagnet segments. Since the array provides magnetic fields which vary in three dimensions with position, forming generally sinusoidal mountains and valleys in the X direction, array 60 may for example find application in positioning devices with six degrees of freedom, array 60 interacting in such applications with suitably activated electromagnetic coils. For example, the array 60 could be mounted to a platen to be positioned with the electromagnets being on a stator. Further, while FIG. 10 assumes Halbach arrays in the two dimensions, a particular desired three-dimensional field pattern may require different winding patterns to be added. These different winding patterns to be added would generally be determined as discussed in conjunction with FIG. 9.

A number of different embodiments have therefore been disclosed for utilizing Halbach magnetic array concepts to develop various useful electromagnetic and three dimensional permanent magnet arrays and to develop other arrays having current densities which vary both parallel to and normal to the array. Further, while both the angular variations and the direction of rotation between successive segments for Halbach type arrays have been the same for a given array, and this is normally preferred, these are not limitations on the invention and may not be the case for some special applications. Thus, while the invention has been particularly shown and described above with respect to various preferred embodiments and variations on such embodiments have been discussed, it is apparent that the foregoing and other changes in form and detail may be made therein by those skilled in the art without departing from the spirit and scope of the invention.

Various mathematical proofs for some embodiments of the invention are provided in the attached appendix which is not to be printed.

What is claimed is:

1. An electromagnet array which extends in a first direction and has a thickness dimension in a second direction the second direction being normal to the first direction, the array comprising:
a plurality of adjacent electromagnet segments which extend in at least one dimension having a selected winding pattern; and
means for selectively applying varying current to said electromagnet segment windings;

said winding patterns being such that the current density for the segments varies in both the first and second directions.

2. An electromagnet array as claimed in claim 1 wherein said means for selectively applying current to said electromagnet segment windings applies current to the windings in a predetermined sequence.

3. An electromagnet array as claimed in claim 1 wherein each of said segments has windings in at least two different phases, and wherein said means for selectively applying current applies appropriate currents to the windings for each of said phases.

4. An electromagnet array as claimed in claim 3 wherein selected magnetic forces are to be provided in both the first and second directions, and wherein the means for selectively applying current includes means for controlling the magnitude of the current applied to each phase of each section so as to achieve the selected magnetic forces.

5. An electromagnet array as claimed in claim 1 wherein each of said electromagnet segments has a winding pattern which are determined as a selected set of sinusoidal variations in at least one dimension perpendicular to said first direction, whereby a desired field pattern may be achieved.

6. An electromagnet array as claimed in claim 5 wherein said winding patterns are triangular to provide a field which is substantially limited to one side of the array.

7. An electromagnet array as claimed in claim 1 wherein said means for selectively applying current includes means for reversing the direction in which said current flows for at least selected ones of said segments, whereby the direction of the magnetic field may be reversed.

8. An electromagnet array as claimed in claim 1 wherein each of said electromagnet segments has windings of a material which is superconducting below a selected temperature, and means for maintaining the windings for at least the segments to which current is being selectively applied below said selected temperature.

9. An electromagnet array as claimed in claim 8 including electromagnetic means interacting with said array to provide mag-lift.

10. An electromagnet array as claimed in claim 1 wherein each electromagnet segment has a magnetic orientation about an axis perpendicular to said first and second directions which is rotated by a selected angle from the orientation of each adjacent electromagnet segment.

11. An electromagnet array as claimed in claim 10 wherein the angle of rotation and the direction of rotation are the same for each adjacent pair of electromagnet segments.

12. An electromagnet array as claimed in claim 10 wherein the selected angle by which the magnetic orientation is rotated between adjacent segments is not more than 90°.

13. An electromagnet array as claimed in claim 1 wherein said array extends in two dimensions, being formed of a matrix of rows and columns of electromagnet segments, with each electromagnet segment having a three dimensional magnetic orientation which is the sum of the magnetic orientations for the segment for its corresponding row and column.

14. A two-dimensional magnetic array comprising:

a plurality of magnet segments arranged in a two-dimensional matrix array of rows and columns, with each segment having at least one adjacent row segment and at least one adjacent column segment, each of said segments having a three dimensional magnetic orientation which is the vector sum of a nominal magnetic orientation for the segment's row and a nominal magnetic orientation for the segment's column, adjacent segments in each column having a nominal magnetic orientation about a row axis which is rotated in a selected direction by an angle of not more than 90° in a selected direction from the nominal column magnetic orientation of each adjacent segment in the column, and adjacent segments in each row having a nominal magnetic orientation about a column axis which is rotated in a selected direction by an angle of not more than 90° in a selected direction from the nominal row magnetic orientation of each adjacent segment in the row.

15. A magnetic array as claimed in claim 12 wherein each of said magnet segments is a permanent magnet segment.

16. An electromagnet array which extends in a first direction and has a thickness dimension in a second direction the second direction being normal to the first direction, the array comprising:

a repetitive pattern of electromagnet windings;

and means for selectively applying varying current to said windings;

the pattern of the windings being such that when current is applied thereto, the current density in the windings varies in both the first and the second directions as a selected sum of sinusoids.

* * * * *